United States Patent [19]
Challis

[11] Patent Number: 5,818,926
[45] Date of Patent: Oct. 6, 1998

[54] SWITCHING DEVICE FOR TELECOMMUNICATIONS CHANNEL

[75] Inventor: Michael Challis, Swindon, United Kingdom

[73] Assignee: Raychem Corporation, Menlo Park, Calif.

[21] Appl. No.: 702,567
[22] PCT Filed: Feb. 24, 1995
[86] PCT No.: PCT/GB95/00382
§ 371 Date: Aug. 22, 1996
§ 102(e) Date: Aug. 22, 1996
[87] PCT Pub. No.: WO95/23455
PCT Pub. Date: Aug. 31, 1995

[30] Foreign Application Priority Data

Feb. 25, 1994 [GB] United Kingdom ............... 9403646

[51] Int. Cl.⁶ .......................... H04M 1/24; H04M 3/22
[52] U.S. Cl. .............................. 379/399; 379/2; 379/29; 379/30; 379/400
[58] Field of Search ........................ 379/399, 2, 27, 379/29, 26, 30, 400, 412, 413; 363/123, 127

[56] References Cited

U.S. PATENT DOCUMENTS

| 4,558,182 | 12/1985 | Perry et al. ........................ 379/29 |
| 4,710,949 | 12/1987 | Ahuja ............................... 379/26 |
| 4,796,290 | 1/1989 | Perry ................................ 379/27 |
| 5,604,785 | 2/1997 | Pryor et al. ...................... 379/39 |
| 5,651,048 | 7/1997 | Leeuw .............................. 379/27 |
| 5,652,575 | 7/1997 | Pryor et al. ...................... 379/27 |

FOREIGN PATENT DOCUMENTS

| 2 149 274A | 6/1985 | United Kingdom ............ H04M 3/22 |
| 2 269 073A | 1/1994 | United Kingdom ............ H04B 3/46 |
| WO94/01961 | 1/1994 | WIPO ............................ H04M 3/30 |

Primary Examiner—Ahmad F. Matar
Assistant Examiner—Jacquies Saint-Surin
Attorney, Agent, or Firm—Timothy H. P. Richardson; Herbert G. Burkard

[57] ABSTRACT

A switching device for a telecommunications channel. The device comprises a voltage detector, a switch, and a storage device. The voltage detector produces an output voltage if the voltage between the lines of the channel exceeds a predetermined level, for example 110 volts. The switch can increase an impedance in one of the lines (preferably causing open circuit) in response to an input voltage. The first storage device, for example a capacitor, produces the input voltage when it reaches a charge $V_2$; is initially at a voltage $V_1$, for example zero, that is less than $V_2$; after charging by the output voltage from the voltage detector, is at a voltage $V_3$ greater than $V_2$; and discharges from $V_3$ to $V_1$ in the absence of the output voltage. The voltage detector comprising a low-pass filter such that an AC signal on the channel produces an output voltage that charges the first storage device to a charge below $V_2$.

19 Claims, 3 Drawing Sheets

SWITCHING DEVICE FOR TELECOMMUNICATIONS CHANNEL

FIELD OF THE INVENTION

This invention relates to a switching device, particularly a maintenance termination unit (MTU) for use in a telephone network.

BACKGROUND OF THE INVENTION

Recent de-regulation of the telecommunications industry has resulted in greater freedom for subscribers to install their own equipment, and as a result telephone companies have insisted that their responsibility for maintenance of the network end at the subscribers' premises. It has therefore become necessary for clear demarcation points to be established and for the telephone companies to be able to determine, preferably remotely, whether any fault lies on the telephone company's or on the subscriber's side of the demarcation point. In order to do this, a so-called maintenance termination unit is installed, generally in or on a subscriber's premises at that point where the telephone cable enters. The intention is that the telephone company can send a special signal along the line to discover not only where any fault lies but also what kind of fault exists, for example whether the fault is an open or short circuit. An MTU is preferably able to disconnect one or both of the lines to the subscriber and also to connect those lines together to allow a loop-back test to be carried out. It is clearly necessary that such disconnection and testing be carried out only when desired and not, for example, in response to a ringing signal or other normal line voltage. Some form of filtering is therefore desirable. Also, it is desirable that the system be fail-safe such that failure of the MTU does not prevent normal operation of the telephone or other subscriber equipment. The present invention therefore provides a particularly advantageous form of filtering, and in a preferred embodiment, employs depletion mode field effect transistors (FETs) as series switches in the lines which will remain conducting in the presence of a fault in their control circuits.

Various designs of MTU have been proposed, of which the following may be mentioned.

GB 2149274 (Teradyne) discloses a pulse-operated remote isolation device comprising normally conducting field effect transistors together with detection circuitry that detects a 130 volt command pulse from the telephone company that activates a control circuit which, by means of a transformer circuit, changes the state of the FETs from a low to a high impedance. In this way, the subscriber's equipment is disconnected. After a fixed period of 16 to 18 seconds, which is determined by a pulse detection timer, the control circuit allows the FETs to return to their conductive state. The circuit required is rather complicated and involves a special counter chip producing an AC output which is fed to a transformer isolating circuit, an output of which is then rectified to provide a control voltage to a chip containing the FETs.

U.S. Pat. No. 4323799 (King) discloses an impulse activated switch having a controlled time-delayed self-restoration from its complimentary state to its initial state. It comprises a photo-diode array connected to gate and source electrodes of a FET to cause the FET to switch. A capacitor that forms part of an RC timing network is also charged by the diode array.

U.S. 4710949 (Ahuja) and GB 2097632 (Phillips) may also be mentioned.

Many of the circuits of the prior art are complicated and require large numbers of electronic components and are consequently likely to be expensive, large and potentially unreliable.

We have now designed an improved MTU in which a timing circuit for delayed reconnection of a subscriber can act as a back-up filter to a primary filter that prevents a normal ringing signal on the line from activating the MTU. Whilst this back-up feature might not be required under perfect conditions, it can allow for greater tolerance in component characteristics, it can allow for initially ideal components to deteriorate with age or to operate outside expected temperatures and it can reject spurious line voltages.

SUMMARY OF THE INVENTION

Thus, the prevent invention provides a switching device for a channel comprising a pair of lines such as a telecommunications channel which comprises:

(i) a voltage detector that produces an output voltage in response to a voltage between the lines above a pre-determined level, preferably about 110 volts;

(ii) a switch, that can change an impedance (preferably increase it) in one of the lines (preferably causing open circuit) in response to an input voltage thereto; characterized in that:

(a) the device additionally comprises a capacitor or other first storage device that produces said input voltage, said input voltage being produced when a storage device reaches a charge $V_2$, said storage device being initially at a voltage $V_1$ (which is preferably zero) that is less than $V_2$ and after charging by the output voltage being at a voltage $V_3$ that is greater than $V_2$, said storage device discharging from $V_3$ to $V_1$ in the absence of the output voltage; and (b) the voltage detector (1) comprises a low-pass filter such that an AC signal on the channel produces an output voltage that charges the first storage device to a charge below $V_2$.

We prefer that the voltage detector produce its output voltage in response to a DC voltage of at least, say, 110 volts between the lines. It may be desirable that the switches be electrically isolated from the voltage detector. We prefer that this be achieved by the use of an opto-electronic device: when the voltage between the lines reaches the pre-determined level a light emitting diode (LED) becomes activated which in turn illuminates a light activatable cell whose output voltage charges the charge storage device. Where a switch is provided in each line of the communications channel, a single LED may power two light-activatable cells one for each switch. In this way each switch is isolated from the other and from the voltage detector. The voltage detector preferably gives rise to said output voltage when a current flows through it, this preferably causing a capacitor to charge. This capacitor may be connected between the gate and the source of a FET in order to bias it into its conductive state when the pre-determined voltage between the lines of the communications channel produces the passage of current through the voltage detector. An LED may be connected in series with this FET, again between the lines of the communications channel. A further circuit may be provided by means of which the capacitor may discharge. The circuit may be configured such that sufficient charge builds up on the capacitor only when a DC or low frequency voltage above a certain value is applied to the lines. At high frequencies, any charge built up on the capacitor during one part of the voltage cycle will be dissipated in a later part. In this way, the voltage detector provides a filtering effect and will not produce said output voltage in response to a ringing signal on the line.

It may happen, due to ageing of components etc., that a ringing signal which should be ignored by the voltage detector in fact produces sufficient charge on the capacitor that the FET is switched. If the error is small the FET will be switched for only a small part of the cycle of the ringing signal, and the LED too will emit light for only a small part of each cycle. In turn the light-activatable cell will produce a brief output which will charge the first storage device. The first storage device will, however, be charged only to a charge below $V_2$. This level of charge is of course insufficient for the switch to open or otherwise to change the impedance in the line. In this way, the first storage device acts as a back-up filter to that provided by the voltage detector.

The first storage device is preferably connected between the gate and the source of a FET which constitutes the switch, and in preferred embodiments that switch is provided in series in the line. In the most simple embodiments the switch is a depletion mode FET since such a FET is normally on and is switched off when a threshold voltage is applied between its gate and source. An advantage of depletion mode FETs is that under normal conditions none of the control circuitry need be active. The control circuitry will therefore be used only during testing and will therefore have a long lifetime. A more complex arrangement could however be produced involving an enhancement mode FET having a voltage applied between its gate and source during normal operation, which voltage is removed in response to said output voltage. Other circuits could be used employing JFETs or bipolar transistors etc.

We prefer that the switching device be able to be positioned in either line (or in both lines either way around) and therefore that it be able to operate properly with voltages of either polarity. This can be achieved by providing as the switch two FETs, preferably depletion-mode FETs, connected back-to-back, preferably with their sources connected together. Such an arrangement can be particularly advantageous. For example it can be current limiting for either polarity, at say 200 mA. Also, the arrangement has a linear I-V characteristic with zero voltage burden, and can readily supply the 20 mA or so required for operation of a telephone circuit.

The switching device may include various further features. For example a shunt switch may be provided between the lines or between one or both of the lines and earth. Such a shunt switch may be able to switch to a low impedance in response to a voltage, such as a voltage of similar magnitude but opposite sign to that to which the voltage detector responds. Thus, a subscriber may be disconnected from a central exchange and a loop back test be carried out to test continuity of that part of the network which is the responsibility of the telephone company.

The switching device may also include a protection circuit to protect the central office and/or the subscriber and/or the MTU from an overcurrent and/or an overvoltage. In a preferred embodiment an overcurrent in one of the lines causes the switches in the lines to become open circuit.

The present invention is further illustrated with respect to the accompanying drawings, in which:

DETAILED DESCRIPTION OF THE DRAWINGS

Figure 1:
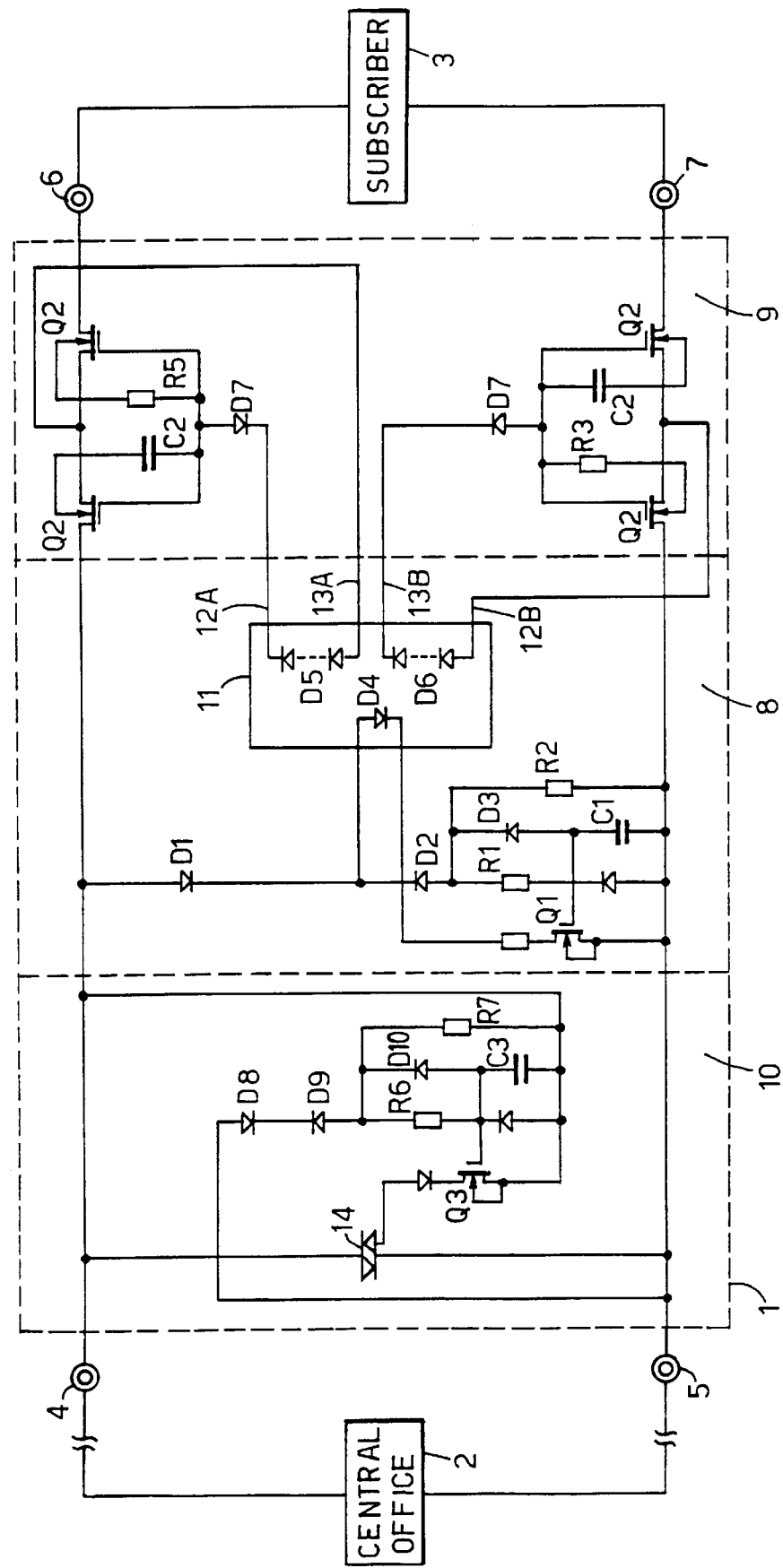
FIG. 1 is a circuit diagram of a first embodiment of the invention.

A switching device 1 of the invention is shown interconnecting a telephone central office 2 and a subscriber 3 at a demarcation point adjacent the subscriber's premises. The switching device 1 has terminals 4, 5, 6 and 7 for connection respectively to the tip line input, ring line input, tip line output and ring line output.

The switching device 1 has been shown subdivided into three parts 8, 9, and 10, although they need not of course be physically separated in the way drawn. Part 8 is a voltage detector, and part 9 is switch in each of the tip and ring lines. Part 10 is an optional loop-back circuit.

The voltage detector 8 works as follows. Diode D1 will be conductive for a positive voltage on the tip line, and diode D2 will be conductive if such a voltage is above its threshold voltage, preferably about 110 volts. A positive voltage on the tip line will therefore charge capacitor C1. Capacitor C1 can however discharge via diode D3 and resistor R2, and as a result the voltage detector can act as a low pass filter. When a ringing voltage is applied between the tip and ring lines, the voltage peaks of which exceed the ringing cycles exceeding the threshold voltage of diode D2, capacitor C2 will charge for part of the ringing cycle. It will however discharge once the voltage of the ringing signal has fallen below the threshold voltage of diode D2. Whether or not charge builds up on capacitor C2 over consecutive ringing cycles will depend upon the time constant of circuit R1/C1 compared to the time constant of circuit C1/D3/R2. In order to avoid activation of the voltage detector by means of a ringing signal the time constant of circuit R1/C1 should be larger than that of circuit C1/D3/R2. Since these circuits have capacitor C1 in common, the time constants will depend on the values of resistors R1 and R2 and therefore we prefer that R1 has a higher resistance than R2. Preferably the resistance of R1 is from 2–4 preferably about 3, times the resistance of R2, and preferred values are about 10 MΩ for resistor R1 and about 330 KΩ for resistor R2. Capacitor C1 preferably has a capacitance of about 330 nf.

When a DC, or sufficiently low frequency, activation signal of sufficient voltage and of the correct polarity is applied between the tip and ring lines, capacitor C1 will charge to a level sufficient to provide a threshold bias voltage between the gate and source of FET Q1. Q1 is an enhancement mode FET and the effect of this bias will be to turn it on. Current will now be able to flow via a current-limiting resistor (of about 20 KΩ from the tip to ring lines via circuit D1/D4/Q1. D4 is an LED that forms part of opto-electronic device 11. The result of the activation signal is therefore emission of light from LED D4. This light illuminates optically- active cells D5 and D6 producing output voltages on lines 12A/13A and 12B/13B. A diode is shown connected across capacitor C1 to provide protection for FET Q1.

These output voltages charge capacitors C2 that are connected between the gate and source electrodes of the FETs constituting the switches in the lines. In the embodiment illustrated a pair of source-connected FETs Q2 is connected in each line. These FETs Q2 are preferably depletion mode FETs having a threshold voltage of $V_2$. The output voltages from the opto-electronic device 11 of the voltage detector 8 charge capacitors C2 from their initial charging level $V_1$ (preferably 0), that is less than $V_2$, and after charging the capacitors are at a voltage $V_3$ that is greater than $V_2$.

After the initial activation voltage has been withdrawn the output from the voltage detector 8 ceases and capacitors C2 discharge from voltage $V_3$ down to voltage $V_1$. The FETs Q2 will therefore be switched off by the activation voltage, and they will remain off during the period over which the capacitors C2 discharge from voltage $V_3$ down to voltage $V_2$. The length of this period can be selected by suitable choice of capacitors C2 and of resistors R3 through which they discharge. The timing constant of this circuit C2/R3 will be chosen to be sufficiently large that all necessary testing can be carried out by the central office before capacitor C2 has discharged to voltage level $V_2$. It will also be chosen to be sufficiently small that the subscriber is not disconnected from the central office for longer than necessary. It can be seen therefore that reconnection of the subscriber is automatic thus avoiding the need for the tester to remember to make a reconnection.

Diodes D7 are present to prevent capacitors C2 discharging via the optically-active cells D5 and D6.

The optional shunt-switch may comprise a triac 14 activated by a second voltage detector similar to voltage detector 8, but preferably connected directly instead of via an electrically-isolating opto-electronic device 11.

The second voltage detector is preferably activated by a voltage between the lines of opposite polarity to that which activates voltage detector 8. This can be seen to be achieved by diodes D8 and D9 which pass current when the ring line is made positive with respect to the tip line at a voltage at least equal to the threshold voltage of diode D9, which is preferably about 110 volts. As in the case of the first-mentioned voltage detector, current will flow through R6 to charge capacitor C3 on receipt of a DC, or low frequency activating voltage of the right voltage and polarity. Capacitor C3, when sufficiently charged, provides a threshold bias between the gate and source electrodes of FET Q3 thus turning it on. Current flow through FET Q3 provides the input to triac 14 necessary to turn it on. As a result the tip and ring lines become interconnected allowing loop-back tests to be carried out by the central office before FET Q3 switches off as a result of capacitor D3 discharging through D10/R7.

Figure 2:
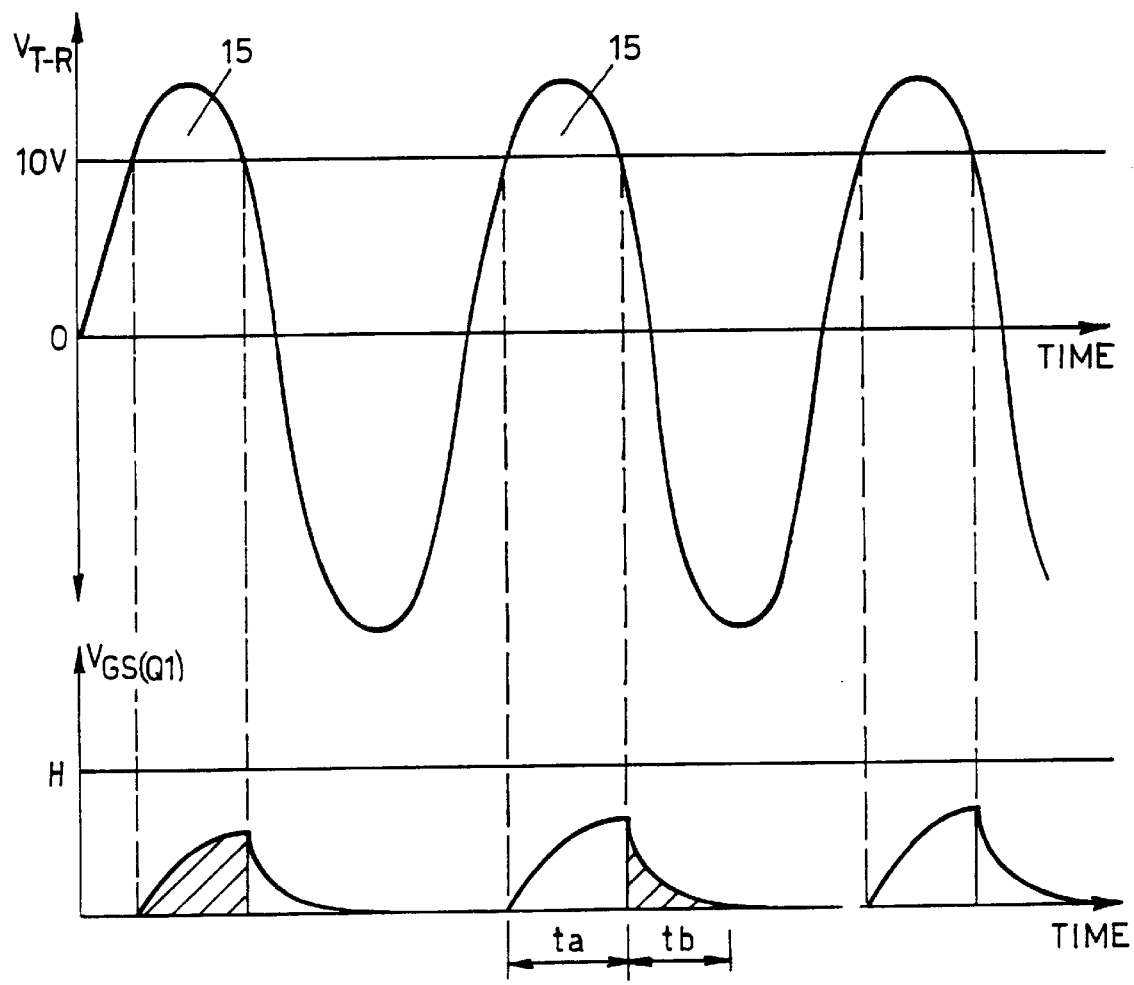
FIG. 2 shows the effect of a ringing signal on the lines.

FIG. 2 shows two voltage plots on two aligned horizontal time axes. The top plot shows a sinoisoidal ringing signal applied between tip and ring lines, whose peak voltage is somewhat greater than the 110 volts threshold of diode D2 of FIG. 1. Since the ringing signal at some points during its cycle exceeds the threshold voltage of this diode, capacitor C1 in FIG. 1 will begin to be charged. This is shown in the lower plot of FIG. 2. During the period in which the ringing signal is greater than 110 volts capacitor C1 is charged and as the ringing signal dips below 110 volts diode D2 will cease to conduct and the charge on capacitor C1 will discharge through resistor R2. The lower plot of FIG. 2 shows that the charge on capacitor C1 which provides the gate source voltage across FET Q1, never reaches the threshold value ($V_{GTH}$) required for Q1 to be switched on. The time constant of circuit C1/D3/R2 is smaller than that circuit R1/C1 and as a result the charge on C1 dissipates more quickly than it was accumulated, and as a result charge does not build up on C1 from one cycle of the ringing signal to the next. In this way the detection circuit 8 acts as a low-pass filter since it is only DC or low-frequencies that produce an output from the opto-electronic device 11.

Figure 3:
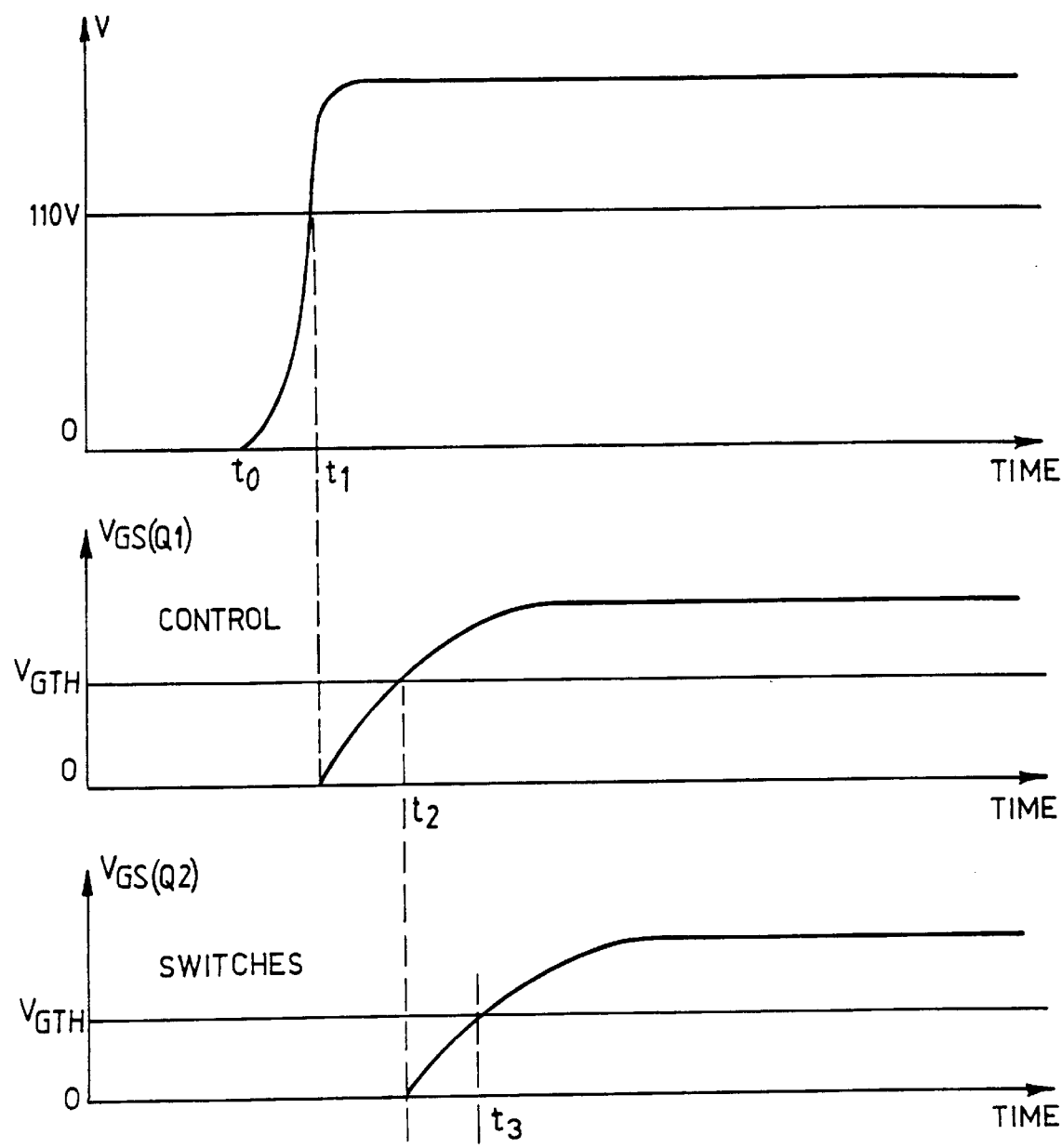
FIG. 3 shows the effect of an activation signal on the lines.

FIG. 3 shows what happens if the characteristics of the components of the voltage detection circuit are not optimum or if the ringing signal has a lower frequency or greater voltage than expected. FIG. 3 consists of three plots again with aligned time axes. In the uppermost plot an activation signal of voltage greater than the 110 threshold voltage of diode D2 is applied at time $T_0$. At time $T_1$ the voltage has risen to 110 volts at which the voltage across capacitor C1

Will begin to rise as is shown in the middle plot. When the voltage across this capacitor has reached $V_{GTH}$, the threshold voltage of FET Q1, that FET will switch on. This occurs at time $T_2$. The opto-electronic device 11 will then produce the output voltage that charges capacitors C2. By time $T_3$ they will have charged sufficiently to produce voltage $V_{GTH}$, the threshold voltage-of FETs Q2. This is shown in the lower-most plot to occur at time $T_3$.

The line switches will therefore switch open after $T_3 - T_0$ has elapsed. If during this period the activation voltage between the lines drops below 110 volts the switches will not open. The capacitors C2 therefore provide a back-up filtering to that of the voltage detector 8 as is represented by the time difference $T_3 - T_2$.

Various tests were performed on the circuit of FIG. 1, giving the following results.

| Transparency Test | | Using Siliconix ND20206 | Using Siemens B55149 0.35 V |
|---|---|---|---|
| 1. | Voltage drop under operational conditions | 1.96 V | 0.35 V |
| 2. | Current leakage under no load, insulation resistance. | 0.023 $\mu$A/4.4 × $10^9$ ohms | 0.05 $\mu$A/2 × $10^9$ ohms |
| 3. | Subscriber loss | MTU disconnects. | MTU disconnects. |
| 4. | Symmetry loss | >65 dB | >65 dB |
| 5. | Return loss of input impedance | 34 dB | 42 dB |
| 6. | Insertion loss in the telephony voice band | 0.24 dB | 0.06 dB |
| 7a. | Distortion during signal transmission | <0.1% at 1 KHz | <0.1% at 1 KHz |
| 7b. | Distortion during signal reception | <0.1% at 1 KHz | <0.1% at 1 KHz |
| 8. | Return loss of input impedance | 23 dB | 37 dB |
| 9. | Insertion loss at 12KHz | 0.63 dB | 0.11 dB |
| 10. | Return loss of input impedance in OVB | 19 dB | 40 dB |
| 11. | Insertion loss in OVB | 0.95 dB | 0.18 dB |
| 12. | Call signal (ringing) loss | <0.5 V | <0.5 V |
| 13. | Measure of input impedance | <0.2 V | <0.2 V |

The transparency tests were carried out using Keithley 228A voltage/current sources, Keithley 195 DMMs, a HP8165, a HP8165A signal source, and a WG SPM12 level meter.

I claim:

1. A switching device for connection to a channel, the channel comprising a pair of lines, wherein said switching device comprises:

(1) a voltage detector which, in use, produces an output voltage in response to a voltage between the lines being above a first predetermined voltage level, and which comprises
      (a) a low pass filter;
      (b) a transistor, which
         (i) if it is a bipolar transistor, comprises a base, a collector and an emitter, and
         (ii) if it is a field effect transistor (FET), comprises a gate, a source and a drain; and
      (c) a second charge storage device connected to the base or gate of the transistor;
   wherein current flow through the voltage detector charges the second charge storage device thereby biasing the gate or base of the transistor, thus allowing current to flow through the transistor, the current through the transistor giving rise to the output voltage;

(2) a switch having an input which is connected to an output of the voltage detector, and which, in use, is connected in series in one of the lines, and can change an impedance in the line in response to an input voltage thereto; and (3) a first charge storage device which, in use:
(i) produces said input voltage when a storage device voltage in the storage device reaches a voltage level $V_2$,
(ii) initially has a storage device voltage level $V_1$ which is less than $V_2$, and, after charging by the output voltage from the voltage detector, has a storage device voltage level $V_3$ which is greater than $V_2$, and
(iii) discharges from $V_3$ to $V_1$ when the output voltage ceases;

wherein an AC signal on the channel causes the low pass filter in the voltage detector to produce an output voltage that charges the first storage device to a voltage level below $V_2$.

2. A device according to claim 1, in which the voltage detector allows passage of current therethrough only when the voltage between the lines exceeds a predetermined minimum voltage.

3. A device according to claim 1, the voltage detector comprising:
(1) a first opto-electronic device; and
(2) a second opto-electronic device;
wherein the current through the transistor flows through the first opto-electronic device thereby generating an optical signal which causes the second opto-electronic device to generate the output voltage.

4. A device according to claim 1 in which the low pass filter comprises a second charge storage device which acquires charge during part of a ringing cycle, which acquired charge is discharged during the remainder of the ringing cycle.

5. A device according to claim 4, in which the charge acquired by the second charge storage device during part of the ringing cycle is sufficient to cause said output voltage, said output voltage charging the first storage device to a voltage below $V_2$.

6. A device according to claim 1, in which the switch comprises an FET having a gate, a source and a drain.

7. A device according to claim 6, in which the switch comprises two source-connected FETs.

8. A device according to claim 6, in which the FET is a depletion-mode FET.

9. A device according to claim 6, in which the FET has its source and drain connected in series with the line.

10. A device according to claim 6, in which the first charge storage device comprises a capacitor connected between the gate and the source of the FET.

11. A device according to claim 1, comprising a second switch, the second switch having an input which is connected to an output of the voltage detector, the second switch connected in series in the other of the lines, and which, in use, can change an impedance in the other of the lines in response to an input voltage thereto.

12. A device according to claim 1, in which the low-pass filter comprises a circuit including a capacitor, the capacitor being arranged to charge through a first circuit path and to discharge through a second circuit path, thereby causing the time constant for charging the capacitor to be greater than that for discharging the capacitor.

13. A device according to claim 1, in which the first storage device comprises a circuit including a capacitor, the capacitor being arranged to charge through a first circuit path and to discharge through a second circuit path, thereby causing the time constant for charging the capacitor to be less than that for discharging the capacitor.

14. A device according to claim 1, comprising a shunt switch which, in use, is connected between the lines, or between one or both of the lines and ground, and which can be caused to switch from a high impedance to a low impedance in response to a voltage between the lines.

15. A device according to claim 14, in which the voltage detector responds to a voltage between the lines of only a first polarity, and the shunt switch responds to a voltage between the lines of only the opposite polarity.

16. A device according to claim 1, in which the switch will produce a high impedance in one of the lines in response to an overcurrent in that line.

17. A device according to claim 1, having a switch in each line, a single said charge storage device producing an input voltage to each of the switches.

18. A device according to claim 1, in which the switch comprises a depletion mode FET having one or more of the following characteristics:
(1) a voltage rating from 12 v to 1000 v;
(2) an on resistance from 1 $\Omega$ to 1000 $\Omega$; and
(3) a maximum current rating from 20 mA to 1500 mA.

19. A circuit comprising
(A) a channel, the channel comprising a pair of lines, and
(B) a switching device, the switching device comprising:
(1) a voltage detector which produces an output voltage in response to a voltage between the lines being above a first predetermined voltage level, and which comprises
(a) a low pass filter;
(b) a transistor, which
(i) if it is a bipolar transistor, comprises a base, a collector and an emitter, and
(ii) if it is a field effect transistor (FET), comprises a gate, a source and a drain; and
(c) a second charge storage device connected to the base or gate of the transistor; wherein current flow through the voltage detector charges the second charge storage device thereby biasing the gate or base of the transistor, thus allowing current to flow through the transistor, the current through the transistor giving rise to the output voltage;
(2) a switch having an input which is connected to an output of the voltage detector, and which is connected in series in one of the lines, and can change an impedance in the line in response to an input voltage thereto; and
(3) a first charge storage device which:
(i) produces said input voltage when a storage device voltage in the storage device reaches a voltage level $V_2$,
(ii) initially has a storage device voltage level $V_1$ which is less than $V_2$, and, after charging by the output voltage from the voltage detector, has a storage device voltage level $V_3$ which is greater than $V_2$, and
(iii) discharges from $V_3$ to $V_1$ when the output voltage ceases;

wherein an AC signal on the channel causes the voltage detector to produce an output voltage that charges the first storage device to a voltage level below $V_2$.

* * * * *

UNITED STATES PATENT AND TRADEMARK OFFICE
CERTIFICATE OF CORRECTION

PATENT NO. : 5,818,926

INVENTOR(S) : Challis

DATED : October 6, 1998

It is certified that error appears in the above-identified patent and that said Letters Patent is hereby corrected as shown below:

Cover Page, [73] Assignee, replace "Raychem Corporation, Menlo Park, California" by -- Raychem Limited, Wiltshire, England--.

Column 2, line 13, replace "prevent" by --present--.

Column 5, line 66, replace "$T_O$, At" by --$T_O$. At--.

Column 6, line 7, replace "voltage-of" by --voltage of--.

Signed and Sealed this

Seventh Day of March, 2000

Attest:

Attesting Officer

Q. TODD DICKINSON

Commissioner of Patents and Trademarks